(12) United States Patent
Nakao et al.

(10) Patent No.: US 6,710,426 B2
(45) Date of Patent: Mar. 23, 2004

(54) SEMICONDUCTOR DEVICE AND TRANSCEIVER APPARATUS

(75) Inventors: Motoyasu Nakao, Sagamihara (JP); Akihiro Sasabata, Yokohama (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 10/389,622

(22) Filed: Mar. 12, 2003

(65) Prior Publication Data

US 2003/0183863 A1 Oct. 2, 2003

(30) Foreign Application Priority Data

Mar. 26, 2002 (JP) ........................ 2002-086248

(51) Int. Cl.[7] .................. H01L 29/00; H01L 29/80; H01L 31/112; H01L 27/108; H01L 29/76
(52) U.S. Cl. .................. 257/532; 257/272; 257/277; 257/296
(58) Field of Search ................ 257/272, 277, 257/296, 532, 535

(56) References Cited

U.S. PATENT DOCUMENTS 6,472,738 B2 * 10/2002 Suzuki ............... 257/698

2002/0117696 A1 * 8/2002 Hirai et al. ........... 257/280

FOREIGN PATENT DOCUMENTS

| JP | 5251629 | 9/1993 |
|---|---|---|
| JP | 669416 | 3/1994 |
| JP | 10294421 | 11/1998 |
| JP | 200068762 | 3/2000 |
| JP | 2001244710 | 9/2001 |
| JP | 200243812 | 2/2002 |

* cited by examiner

*Primary Examiner*—Ngân V. Ngô
(74) *Attorney, Agent, or Firm*—Ostrolenk, Faber, Gerb & Soffen, LLP

(57) ABSTRACT

A field effect transistor (FET) is formed on a semiconductor substrate. A drain terminal, a source terminal, and a gate terminal connected to the FET are also formed on the semiconductor substrate. In an embodiment of the invention, a metal insulator metal (MIM) capacitor for blocking a bias current is disposed between the FET and the drain terminal. A bias terminal is provided between the MIM capacitor and the FET. Passive circuits connected to the drain terminal, the source terminal, and the gate terminal, and a bias circuit connected to the bias terminal are formed on a dielectric substrate. With this arrangement, the circuitry on the semiconductor substrate can be simplified. The general versatility of a resulting semiconductor device can be increased, and the size of the semiconductor device can be reduced.

14 Claims, 19 Drawing Sheets

SEMICONDUCTOR DEVICE AND TRANSCEIVER APPARATUS

BACKGROUND OF THE INVENTION

1. Field of the Invention

The present invention relates to a semiconductor device provided with an active element and a passive element, suitable for use in performing, for example, signal processing on microwave or millimeter wave signals. The invention also relates to a transceiver apparatus using this type of semiconductor device.

2. Description of the Related Art

A known type of semiconductor device is a monolithic microwave integrated circuit (MMIC), in which active elements, such as transistors, and passive elements, such as resistor elements, capacitor elements, and inductor elements, are monolithically formed on the same semiconductor substrate (see, for example, "Monolithic Microwave Integrated Circuit" edited by The Institute of Electronics, Information and Communication Engineers, Corona Publishing Co., Ltd. published on Jan. 25, 2003.)

In this known art, active elements and passive elements are simultaneously and integrally formed on a semiconductor substrate formed of, for example, gallium arsenide (GaAs) or silicon (Si), according to a semiconductor manufacturing process.

In a semiconductor device formed by the above-described known technique, active elements, passive elements, and wiring patterns for connecting these elements are integrally formed on an expensive semiconductor substrate formed of, for example, GaAs. Accordingly, the chip size of the resulting MMIC becomes large, thereby increasing the manufacturing cost.

All the elements formed on the semiconductor device are used for specific applications, and the resulting MMIC is restricted to such specific applications. Because of this low general versatility, such MMICs cannot be mass-produced, thereby making it difficult to achieve a cost reduction.

Additionally, all the elements are integrally formed on a semiconductor substrate as described above. It is thus necessary to design the overall circuit according to a particular application, thereby prolonging the design period.

SUMMARY OF THE INVENTION

Accordingly, in view of the above-described problems unique to the related art, the present invention provides a semiconductor device and a transceiver apparatus having high general versatility and a lower manufacturing cost.

In order to achieve the above-described advantages, the present invention provides a semiconductor device including a field effect transistor (FET), and a drain terminal, a source terminal, and a gate terminal, all of which are connected to the FET. A metal insulator metal (MIM) capacitor, which is formed by sandwiching a thin-film dielectric member between metallic layers, is connected in series between the FET and at least one of the drain terminal, the source terminal, and the gate terminal. The MIM capacitor blocks DC bias components, and self-resonates in a desired frequency range of a high frequency signal. A bias terminal is connected between the MIM capacitor and the FET. A passive element is connected to at least one of the drain terminal, the source terminal, and the gate terminal. The FET, the drain terminal, the source terminal, the gate terminal, the MIM capacitor, and the bias terminal are disposed on a semiconductor substrate, and the passive element is disposed on a dielectric substrate.

With this configuration, only the FET, which is an active element, and the drain terminal, the source terminal, the gate terminal, the bias terminal, and the MIM capacitor are disposed on the semiconductor substrate, and the other elements, i.e., the passive elements, can be eliminated from the semiconductor substrate. This makes it possible to simplify the circuitry on the semiconductor substrate. The general versatility of the semiconductor device can be increased, and the size of the semiconductor device can be reduced, thereby decreasing the manufacturing cost.

In this case, the MIM capacitor may be connected in series between the FET and the drain terminal. With this arrangement, since the bias terminal is connected between the FET and the MIM capacitor connected to the drain terminal, a bias voltage can be applied to the drain of the FET via the bias terminal.

Alternatively, the MIM capacitor may be connected in series between the FET and each of the drain terminal and the gate terminal. In this case, a bias terminal is connected between the FET and the MIM capacitor connected to the drain terminal, and another bias terminal is connected between the FET and the MIM capacitor connected to the gate terminal. Accordingly, a bias voltage can be applied to the drain or the gate of the FET via the corresponding bias terminal.

Alternatively, the MIM capacitor may be connected in series between the field effect transistor and each of the drain terminal and the source terminal. In this case, a bias terminal is connected between the FET and the MIM capacitor connected to the drain terminal, and another bias terminal is also connected between the FET and the MIM capacitor connected to the source terminal. Accordingly, a bias voltage can be applied to the drain or the source of the FET via the corresponding bias terminal.

Alternatively, the MIM capacitor may be connected in series between the FET and each of the source terminal and the gate terminal. In this case, a bias terminal is connected between the FET and the MIM capacitor connected to the source terminal, and another bias terminal is also connected between the FET and the MIM capacitor connected to the gate terminal. Accordingly, a bias voltage can be applied to the source or the gate of the FET via the corresponding bias terminal.

Alternatively, the MIM capacitor may be connected in series between the FET and each of the drain terminal, the source terminal, and the gate terminal.

In this case, a bias terminal is connected between the FET and the MIM capacitor connected to each of the drain terminal, the source terminal, and the gate terminal. Accordingly, a bias voltage can be applied to the drain, the source, or the gate of the FET via the corresponding bias terminal.

The dielectric constant of the dielectric substrate may be set to be higher than that of the semiconductor substrate. With this arrangement, a passive element including a capacitor formed on the dielectric substrate can be made smaller than that formed on the semiconductor substrate, thereby reducing the size of the overall device.

The invention further relates to a semiconductor device including a transistor having a control electrode and a pair of main electrodes. The transistor may be a field effect transistor (FET) and the control and main electrodes may correspond to the gate, source, and drain of the FET, respectively. A control terminal and a pair of main terminals are connected respectively to the control and main electrodes of the transistor. A metal-insulator-metal (MIM) capacitor is connected in series between at least one of the main and control electrodes and the corresponding terminal. A bias terminal is connected between the MIM capacitor and the transistor. A passive element is connected to at least one of the control and main terminals. The MIM capacitor blocks DC bias components, and self-resonates in a desired frequency range of a high frequency signal. The transistor, the control and main terminals, the MIM capacitor, and the bias terminal are disposed on a semiconductor substrate, and the passive element is disposed on a dielectric substrate.

The present invention also provides a transceiver apparatus utilizing the aforementioned semiconductor device.

Other features and advantages of the present invention will become apparent from the following description of embodiments of the invention which refers to the accompanying drawings.

DESCRIPTION OF EMBODIMENTS OF THE INVENTION

Figure 1:
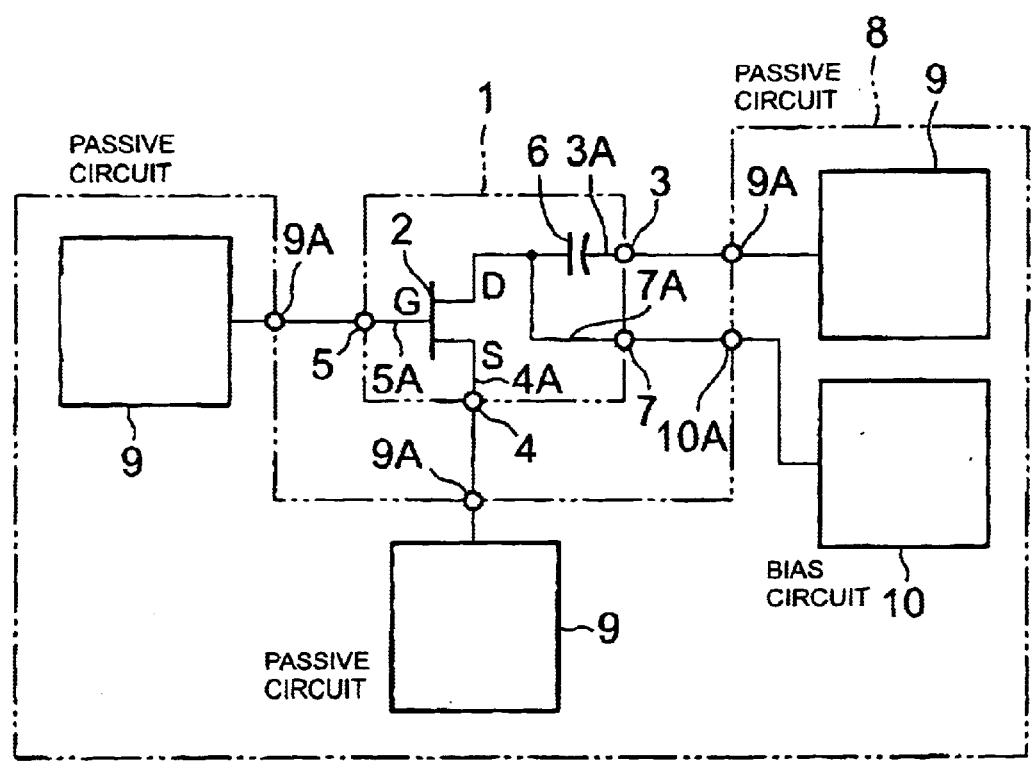
FIG. 1 is an electric circuit diagram illustrating a semiconductor device according to a first embodiment of the present invention.

A semiconductor device according to embodiments of the present invention is described in detail below with reference to the accompanying drawings.

A first embodiment of the present invention is discussed below with reference to FIGS. 1 through 9. In FIGS. 1 through 9, a semiconductor substrate 1 is formed generally in a quadrilateral planar shape from a semiconductor material, such as gallium arsenide or silicon.

A field effect transistor (hereinafter referred to as an "FET") 2 is formed on the surface of the semiconductor substrate 1 according to any one of many known semiconductor-manufacturing processes. The FET 2 is connected to external circuits via a drain terminal 3, a source terminal 4, and a gate terminal 5, which are described below.

The drain terminal 3, the source terminal 4, and the gate terminal 5, which are formed of electrode pads connected to the FET 2, are respectively connected to drain D, source S, and gate G of the FET 2 via wiring patterns 3A, 4A, and 5A, which are formed of metallic thin film on the surface of the semiconductor substrate 1.

A metal insulator metal (MIM) capacitor 6, which is formed by sandwiching a thin-film dielectric member between metallic layers, is disposed on the wiring pattern 3A between the FET 2 and the drain terminal 3. The MIM capacitor 6 is formed together with the FET 2 and the other elements formed on the semiconductor substrate 1 according to a known semiconductor manufacturing process. The MIM capacitor 6 prevents a DC bias current supplied to the drain D from being supplied to the drain terminal 3 by blocking the DC bias current.

A bias terminal 7, connected between the MIM capacitor 6 and the FET 2, is connected to drain D of the FET 2 via a wiring pattern 7A branched off from the wiring pattern 3A.

A dielectric substrate 8 is formed of, for example, a resin material or a ceramic material, and the dielectric constant thereof is set to be higher than that of the semiconductor substrate 1.

Passive circuits 9 formed on the dielectric substrate 8 include passive elements, such as a resistor element, a capacitor element, and an inductor element. The passive circuits 9 are formed by various electrode patterns, microstrip lines, stub lines, and slots formed on the surface of the dielectric substrate 8. The passive circuits 9 are connected to the drain terminal 3, the source terminal 4, and the gate terminal 5 via terminals 9A disposed on the dielectric substrate 8. The passive circuits 9 include matching circuits for providing impedance matching between the FET 2 and external circuits, phase shifters for adjusting the phase, attenuators for adjusting the attenuation, resonators, and filters.

A bias circuit 10, formed on the dielectric substrate 8, is connected to the bias terminal 7 via a terminal 10A. The bias circuit 10 is used for applying a DC bias voltage to drain D of the FET 2 via the bias terminal 7.

Figure 2:
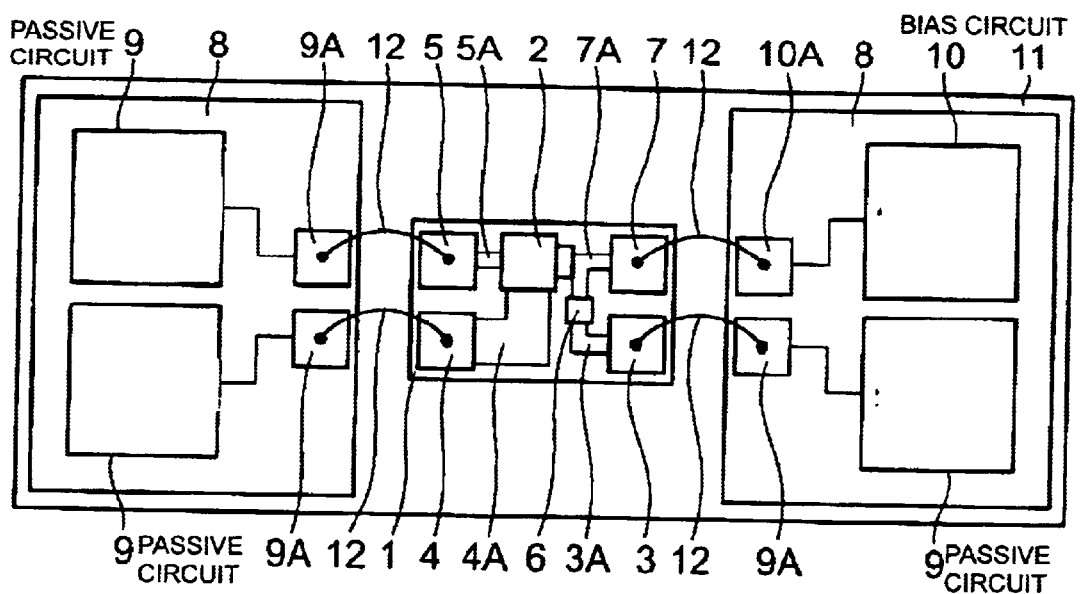
FIG. 2 is a plan view illustrating the semiconductor device of the first embodiment wherein a semiconductor substrate and a dielectric substrate are placed on a main substrate.

The semiconductor substrate 1 and the dielectric substrate 8 may be disposed on a main substrate 11, as shown in FIG. 2. Alternatively, the semiconductor substrate 1 may be placed on the dielectric substrate 8, as shown in FIG. 3.

Figure 3:
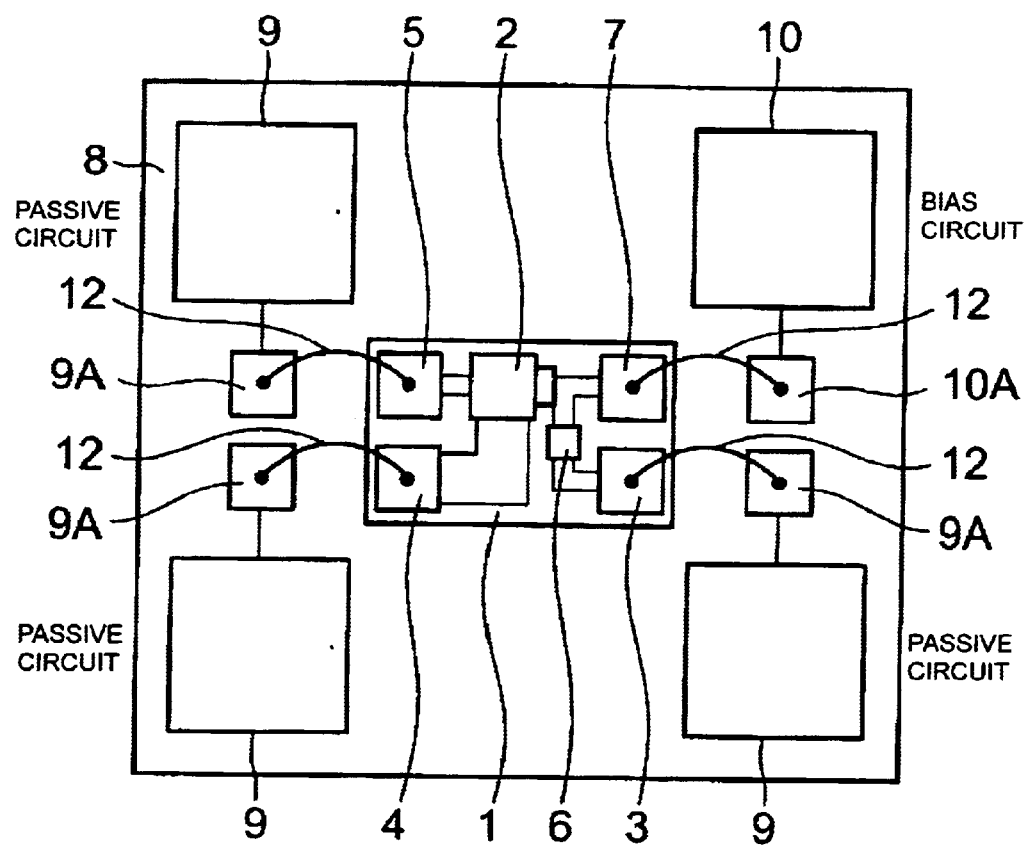
FIG. 3 is a plan view illustrating the semiconductor device of the first embodiment the semiconductor substrate is placed on the dielectric substrate.
Figure 4:
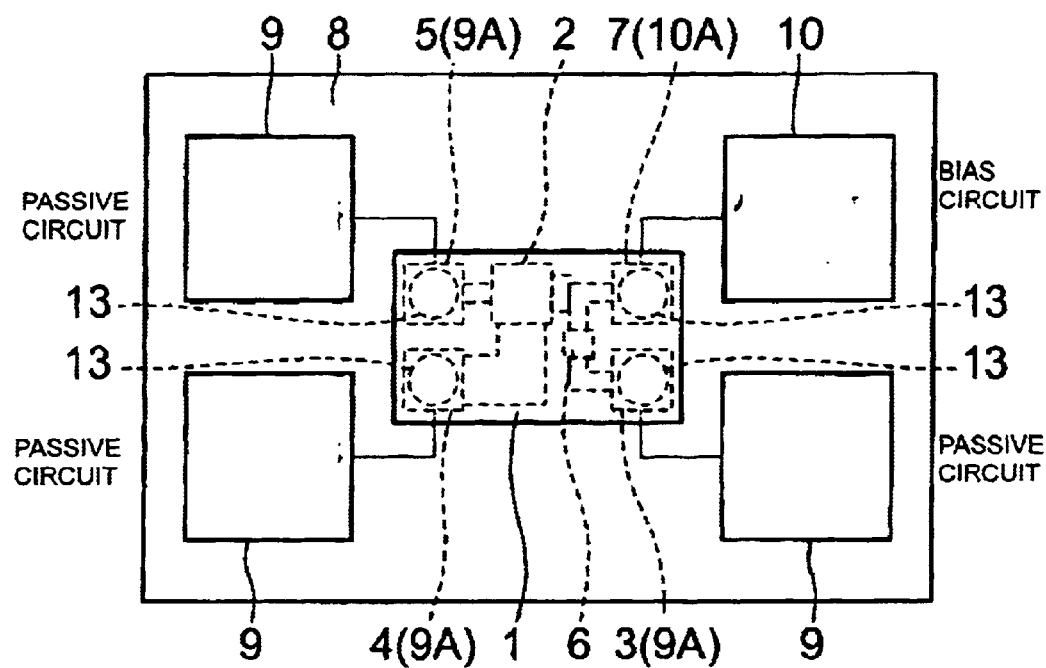
FIG. 4 is a plan view illustrating the semiconductor device of the first embodiment the semiconductor substrate is mounted on the dielectric substrate by flip-chip bonding.

The terminals 3, 4, 5, and 7 on the semiconductor substrate 1 may be connected, as shown in FIGS. 2 and 3, to the terminals 9A and 10A on the dielectric substrate 8 by using bonding wires 12. Alternatively, flip-chip bonding may be performed, as shown in FIG. 4. The surface of the semiconductor substrate 1 is arranged facing the surface of the dielectric substrate 8 (i.e., the semiconductor substrate 1 is turned over), and then, the terminals 3, 4, 5, and 7 are connected to the terminals 9A and 10A on the dielectric substrate 8 by using solder balls 13.

Figure 5:
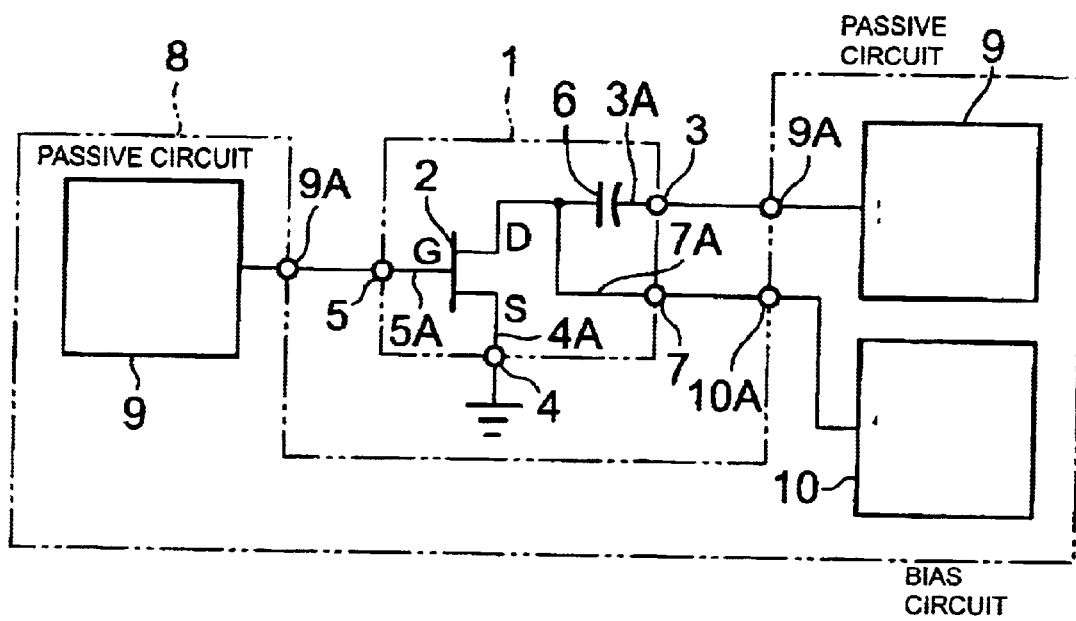
FIG. 5 is an electric circuit diagram illustrating the semiconductor device of the first embodiment wherein the source terminal on the semiconductor substrate is grounded.

The source terminal 4 of the FET 2 is connected to the passive circuit 9 on the dielectric substrate 8 as described above. Alternatively, the source terminal 4 may be grounded, as shown in FIG. 5. The configuration of the passive circuits 9 on the dielectric substrate 8 may be suitably changed according to the specification of the semiconductor device.

The operation of the above-configured semiconductor device of the first embodiment is as follows.

The bias circuit 10 applies a bias voltage to drain D of the FET 2 via the bias terminal 7. In this state, a gate voltage is applied to the gate terminal 5 of the FET 2, and thus, a bias point of the FET 2 is determined. This makes it possible to perform various types of signal processing, such as amplification and modification, on high frequency signals.

The operation of the MIM capacitor 6 is discussed below with reference to FIGS. 6 through 8.

When manufacturing a semiconductor device having a function, such as an amplifier or a mixer, by using the FET 2, a DC cut-off capacitor must be connected for blocking a bias current, which is applied when driving the FET 2. In this embodiment, therefore, a DC cut-off capacitor is formed by the MIM capacitor 6 on the semiconductor substrate 1.

Figure 6:
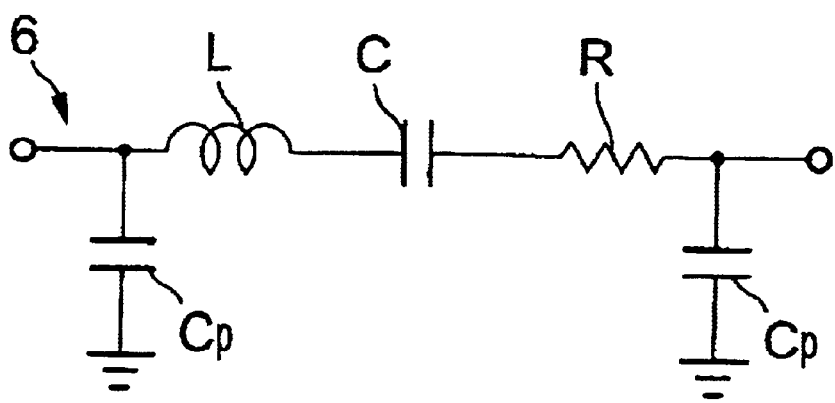
FIG. 6 is an equivalent circuit diagram of a metal insulator metal (MIM) capacitor used in the first embodiment.

As indicated by the equivalent circuit in FIG. 6, the MIM capacitor 6 can be represented by an inductance component L, a capacitance component C, and a resistance component R, which are connected in series to each other, and also by parasitic capacitance components Cp connected between an input terminal and a ground and between an output terminal and a ground. Accordingly, by utilizing series resonance of the inductance component L and the capacitance component C, the MIM capacitor 6 serves as a DC cut-off capacitor but passes RF signals in the corresponding resonant frequency range.

In the GaAs semiconductor substrate 1, at a self-resonant frequency of about 10 GHz, the electrode area of the MIM capacitor 6 becomes about 2500 $\mu m^2$ (for example, a square having a side of 50 $\mu m$), and at a self-resonant frequency of about 20 GHz, the electrode area of the MIM capacitor 6 becomes about 625 $\mu m^2$ (for example, a square having a side of 25 $\mu m$). In a semiconductor device used for high frequency signals in a microwave, millimeter or submillimeter wave band, the MIM capacitor 6, which serves as a DC cut-off capacitor, can be formed to a small size on the semiconductor substrate 1. Accordingly, the formation of the MIM capacitor 6 on the semiconductor substrate 1 does not require a large area of the semiconductor substrate 1.

In contrast, as a first comparative example, a MIM capacitor usable as a DC cut-off capacitor can be formed on the dielectric substrate 8 rather than on the semiconductor substrate 1. As in the first embodiment, the MIM capacitor can be formed to a small size on the dielectric substrate 8. In this case, however, the MIM capacitor, which has a thin-film multi-layered structure, must be formed by a manufacturing step separately from the passive circuit 9. This increases the number of manufacturing steps, thereby increasing the manufacturing cost.

When comparing the size of the semiconductor substrate 1 on which the FET 2 is formed with that of the dielectric substrate 8 on which the passive circuit 9 is formed, the dielectric substrate 8 becomes larger than the semiconductor substrate 1 since the passive circuit 9 is larger than the FET 2. In addition, the addition of a MIM capacitor on the dielectric substrate 8 makes it necessary to form the large dielectric substrate 8 in a thin-film multi-layered structure. As a result, the manufacturing cost (chip cost) per unit area must be increased.

Alternatively, as a second comparative example, a distributed-constant coupled line, such as an opened stub, can be formed as the DC cut-off capacitor on a single-layered dielectric substrate 8. In this case, a length of about ¼ of the wavelength is required for the coupled line. When the relative dielectric constant of the dielectric substrate 8 is 10, ¼ the wavelength in the dielectric member is equal to approximately 2.4 mm at 10 GHz, and is equal to approximately 1.2 mm at 20 GHz. The length required for the MIM capacitor 6 when formed on the dielectric substrate 8 is much greater than that when formed on the semiconductor substrate 1.

Figure 7:
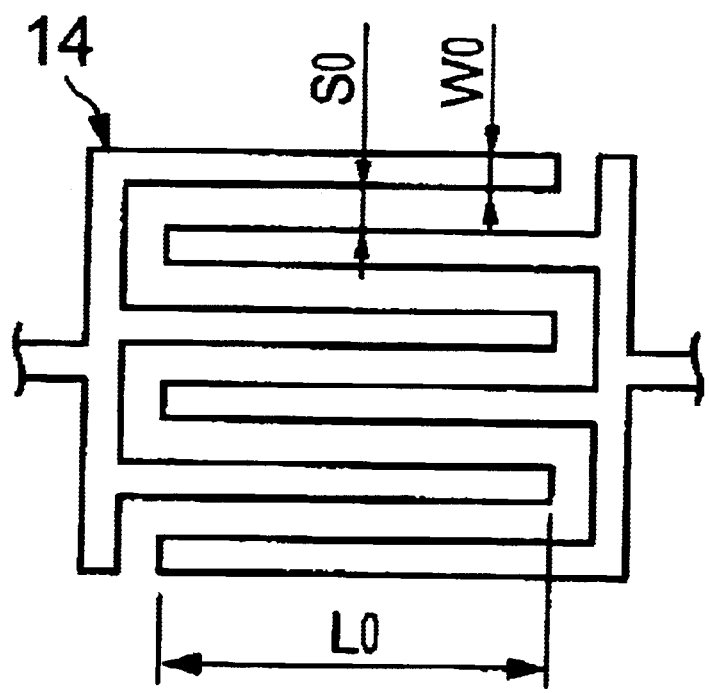
FIG. 7 is a plan view illustrating an interdigital capacitor as a third comparative example.

As a third comparative example, an interdigital capacitor 14 including interdigital electrodes, such as that shown in FIG. 7, may be formed on a single-layered dielectric substrate 8 as the DC cut-off capacitor. In this case, although the equivalent circuit of the interdigital capacitor 14 becomes substantially equal to that of the MIM capacitor 6 shown in FIG. 6, the parasitic capacitance components Cp present the following problem.

The dimensions of the interdigital capacitor 14 were set, for example, in which the electrode width W0 was 10 $\mu m$; the inter-electrode spacing S0 was 10 $\mu m$; and the electrode length L0 was 200 $\mu m$. The relative dielectric constant and the thickness of the dielectric substrate 8 were set to be 38 and 0.3 mm, respectively. Ten electrodes were provided so that the insertion loss would become minimum in the 20 GHz band. Under these conditions, an electromagnetic-field simulation was performed, resulting in a reflection characteristic indicated by A0 in FIG. 8 and a bandpass characteristic indicated by A1 in FIG. 9. For comparison, the reflection characteristic indicated by B0 and the bandpass characteristic indicated by B1, of an MIM capacitor 6 having a self-resonant frequency of 20 GHz formed on the GaAs semiconductor substrate 1, are also indicated in FIGS. 8 and 9, respectively.

Figure 8:
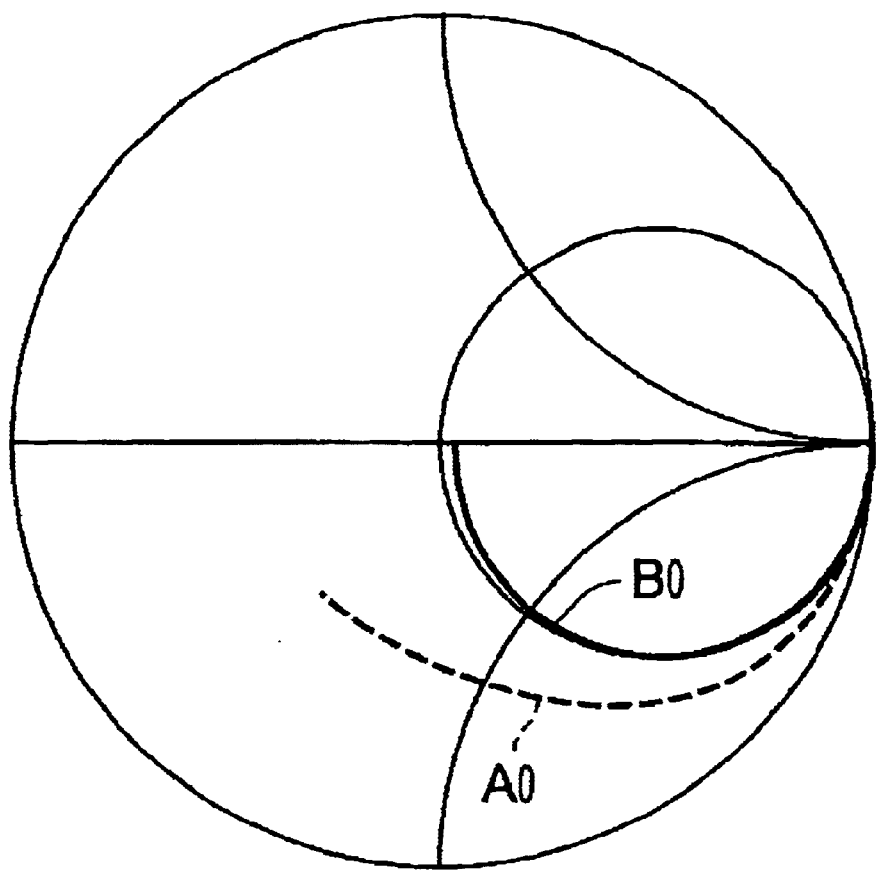
FIG. 8 is a Smith chart illustrating the impedances of the MIM capacitor and the interdigital capacitor.
Figure 9:
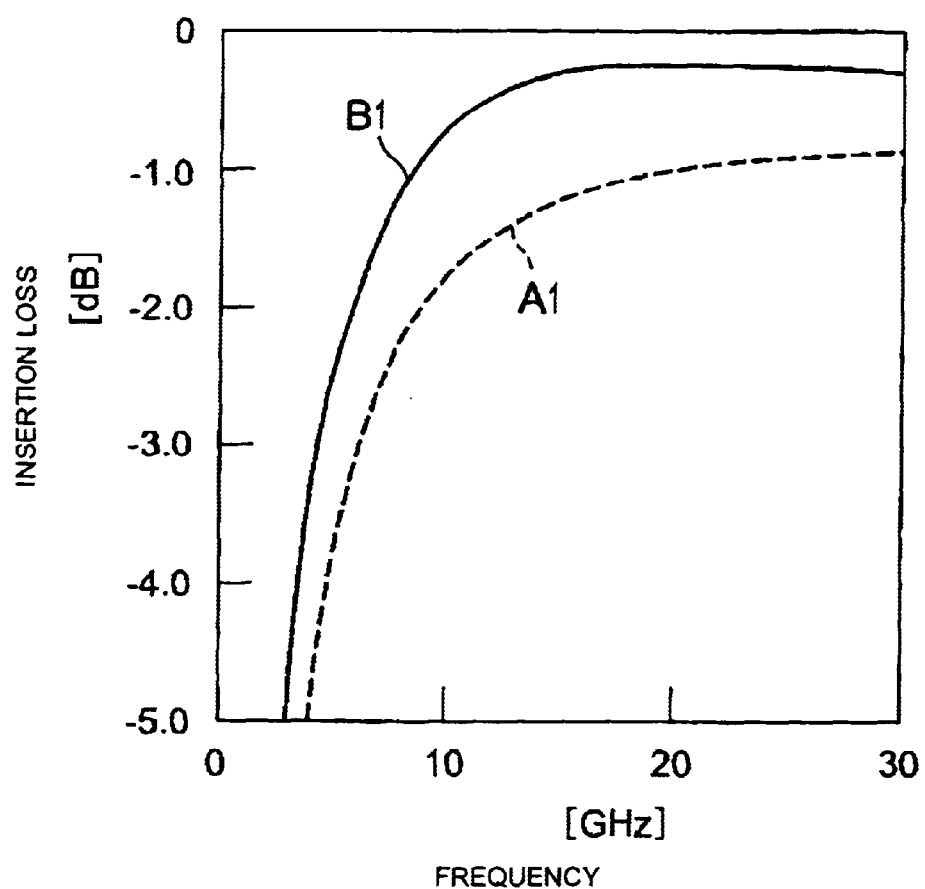
FIG. 9 is a diagram illustrating the insertion loss of the MIM capacitor and that of the interdigital capacitor with respect to the frequency.

The Smith chart of FIG. 8 shows that the impedance of the MIM capacitor 6 indicated by B0 changes along a 50Ω circle, which is a characteristic impedance, as the frequency increases, and that the impedance of the interdigital capacitor 14 indicated by A0 is progressively displaced from the 50Ω circle as the frequency increases.

This is due to the mismatching caused by the parasitic capacitance components Cp. In the above-described simulation, the parasitic capacitance components Cp of the MIM capacitor 6 are as low as 0.001 pF, while the parasitic capacitance components Cp of the interdigital capacitor 14 are as high as about 0.07 pF. Because of this mismatching due to the parasitic capacitance components Cp, the insertion loss of the interdigital capacitor 14 for high frequency signals of 20 GHz becomes as high as 1.05 dB, as indicated by the bandpass characteristic A1 in FIG. 9, while the insertion loss of the MIM capacitor 6 is only 0.28 dB, as indicated by the bandpass characteristic B1 in FIG. 9. The parasitic capacitance components Cp can be decreased by increasing the thickness of the dielectric substrate 8 or by reducing the electrode width W0 and the inter-electrode spacing S0. However, a thicker dielectric substrate 8 increases the height of the overall semiconductor device. On the other hand, with a narrower electrode width W0 or inter-electrode spacing S0, high-precision microfabrication is required, thereby increasing the manufacturing cost and possibly also causing wide variations in the characteristics of the semiconductor devices.

Additionally, the electrode area of the MIM capacitor 6 is 625 $\mu m^2$, while the electrode area of the interdigital capacitor 14 is as large as 45600 $\mu m^2$.

As discussed above, it can be proved that the MIM capacitor 6 formed on the semiconductor substrate 1 as the DC cut-off capacitor compares favorably with that formed on the dielectric substrate 8 since excellent electrical characteristics, such as the reflection characteristic and the bandpass characteristic, can be exhibited. Additionally, the size of the DC cut-off capacitor can be reduced, and the manufacturing cost can accordingly be decreased.

Thus, according to this embodiment, the FET 2, the drain terminal 3, the source terminal 4, the gate terminal 5, the MIM capacitor 6, and the bias terminal 7 are formed on the semiconductor substrate 1, and the passive circuit 9 is formed on the dielectric substrate 8. Accordingly, the passive circuit 9, which requires a large mounting area, can be eliminated from the expensive semiconductor substrate 1. This makes it possible to reduce the size of the semiconductor substrate 1, and the manufacturing cost can be reduced.

Without the passive circuit 9 on the semiconductor substrate 1, the circuit mounted on the semiconductor substrate 1 can be simplified. Thus, the circuit formed on the semiconductor substrate 1 can be connected to the circuit formed on the dielectric substrate 8 shown in FIG. 1 or 5, thereby increasing the general versatility of the circuit formed on the semiconductor substrate 1.

Since the MIM capacitor 6 is connected in series with the drain terminal 3, a bias voltage can be applied to drain D of the FET 2 via the bias terminal 7 connected between the MIM capacitor 6 and the FET 2 to drive the FET 2.

Additionally, the dielectric constant of the dielectric substrate 8 is set to be higher than that of the semiconductor substrate 1. Thus, if the passive circuit 9 includes a stub, a resonator, or a capacitor, which requires a length according to the wavelength of high frequency signals in the dielectric substrate 8, the size of the passive circuit 9 can be made smaller than if it were formed on the semiconductor substrate 1, thereby decreasing the overall size of the semiconductor device.

A second embodiment of the present invention is described below with reference to FIGS. 10 and 11. In the second embodiment, an MIM capacitor is connected in series between the FET 2 and the drain terminal 3 and between the FET 2 and the gate terminal 5. In the second embodiment, the same elements as those of the first embodiment are designated with like reference numerals, and an explanation thereof is thus omitted.

A first MIM capacitor 21 is disposed between the FET 2 and the drain terminal 3. As with the MIM capacitor 6 of the first embodiment, the first MIM capacitor 21, which is formed by sandwiching a thin-film dielectric member between metallic layers, is disposed on the wiring pattern 3A connected to the drain terminal 3.

A second MIM capacitor 22, which is formed by sandwiching a thin-film dielectric member between metallic layers, is disposed in the wiring pattern 5A between the gate terminal 5 and the FET 2.

A first bias terminal 23, connected between the first MIM capacitor 21 and the FET 2, is connected to drain D of the FET 2 via a wiring pattern 23A branched off from the wiring pattern 3A, and is also connected to the bias circuit 10 on the dielectric substrate 8.

A second bias terminal 24, connected between the second MIM capacitor 22 and the FET 2, is connected to gate G of the FET 2 via a wiring pattern 24A branched off from the wiring pattern 5A, and is also connected to the bias circuit 10 on the dielectric substrate 8.

Figure 10:
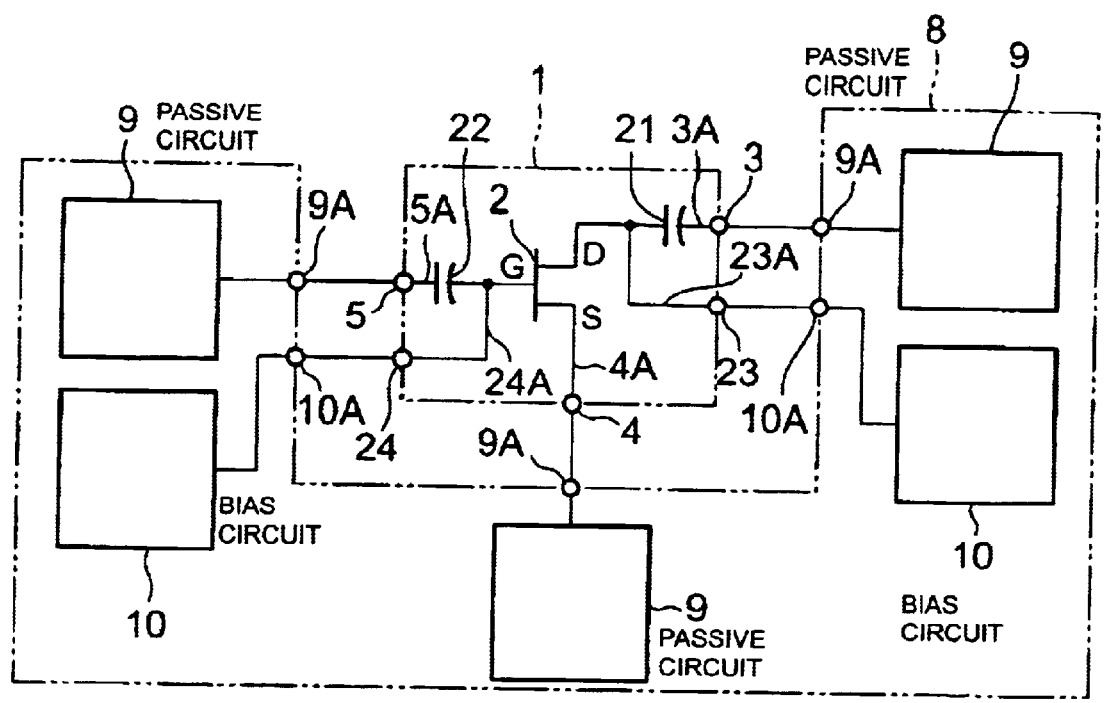
FIG. 10 is an electric circuit diagram illustrating a semiconductor device according to a second embodiment of the present invention.
Figure 11:
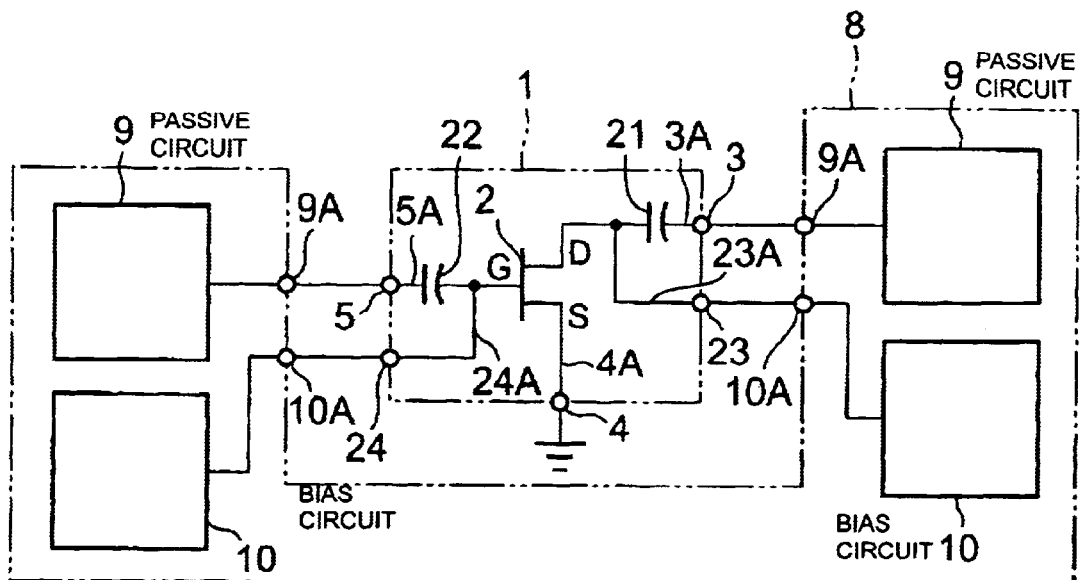
FIG. 11 is an electric circuit diagram illustrating the semiconductor device of the second embodiment when the source terminal on the semiconductor substrate is grounded.

Although the source terminal 4 of the FET 2 is connected, as shown in FIG. 10, to the passive circuit 9 on the dielectric substrate 8, it may be grounded, as shown in FIG. 11.

The second embodiment offers advantages similar to those obtained by the first embodiment. In the second embodiment, since the first and second MIM capacitors 21 and 22 are respectively connected in series between the FET 2 and the drain terminal 3 and between the FET 2 and the gate terminal 5, bias voltages can be applied to drain D and gate G of the FET 2 via the first and second bias terminals 23 and 24, respectively, to drive the FET 2.

In the second embodiment, the first and second MIM capacitors 21 and 22 are respectively connected in series between the FET 2 and the drain terminal 3 and between the FET 2 and the gate terminal 5. However, because of the structure of the FET 2 in which drain D and source S are symmetrical to each other with respect to gate G, the drain terminal 3 and the source terminal 4 may be swapped, and then, the MIM capacitors 21 and 22 can be connected in series between the FET 2 and the source terminal 4 and between the FET 2 and the gate terminal 5. In this case, advantages similar to those offered by the second embodiment can be obtained.

A third embodiment of the present invention is described below with reference to FIGS. 12 through 14. In third embodiment, MIM capacitors are connected in series between the FET 2 and the drain terminal 3 and the FET 2 and the source terminal 4. In the third embodiment, the same elements as those of the first embodiment are indicated by like reference numerals, and an explanation thereof is thus omitted.

A first MIM capacitor 31 is disposed between the FET 2 and the drain terminal 3. As with the MIM capacitor 6 of the first embodiment, the first MIM capacitor 31, which is formed by sandwiching a thin-film dielectric member with metallic layers, is disposed on the wiring pattern 3A connected to the drain terminal 3.

A second MIM capacitor 32 is connected between the FET 2 and the source terminal 4. The second MIM capacitor 32, which is formed by sandwiching a thin-film dielectric film with metallic layers, is disposed on the wiring pattern 4A connected to the source terminal 4.

A first bias terminal 33, connected between the first MIM capacitor 31 and the FET 2, is connected to drain D of the FET 2 via a wiring pattern 33A branched off from the wiring pattern 3A, and is also connected to the bias circuit 10 on the dielectric substrate 8.

A second bias terminal 34, connected between the second MIM capacitor 32 and the FET 2, is connected to source S of the FET 2 via a wiring pattern 34A branched off from the wiring pattern 4A, and is also connected to the bias circuit 10 on the dielectric substrate 8.

Figure 12:
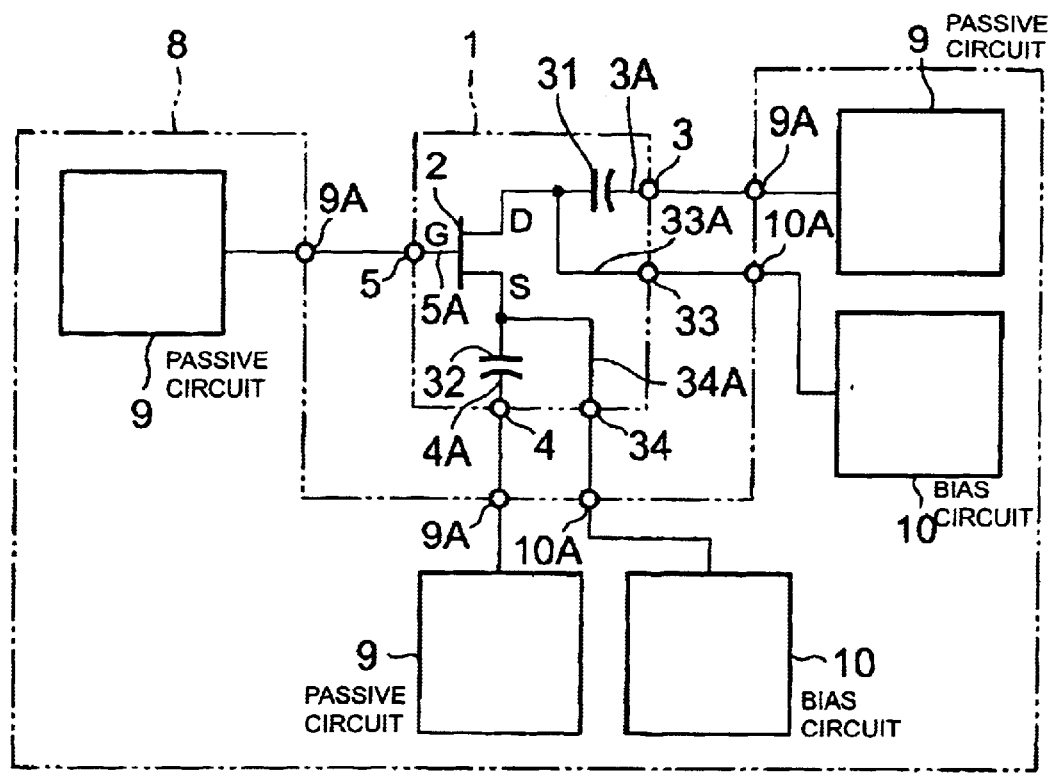
FIG. 12 is an electric circuit diagram illustrating a semiconductor device according to a third embodiment of the present invention.

The source terminal 4 of the FET 2 is connected, as shown in FIG. 12, to the passive circuit 9 on the dielectric substrate 8. However, as shown in FIG. 13, the source terminal 4 of the FET 2 may be grounded, and also, the second bias terminal 34 may be connected to a self-biasing resistor 36 provided on the dielectric substrate 8.

Figure 13:
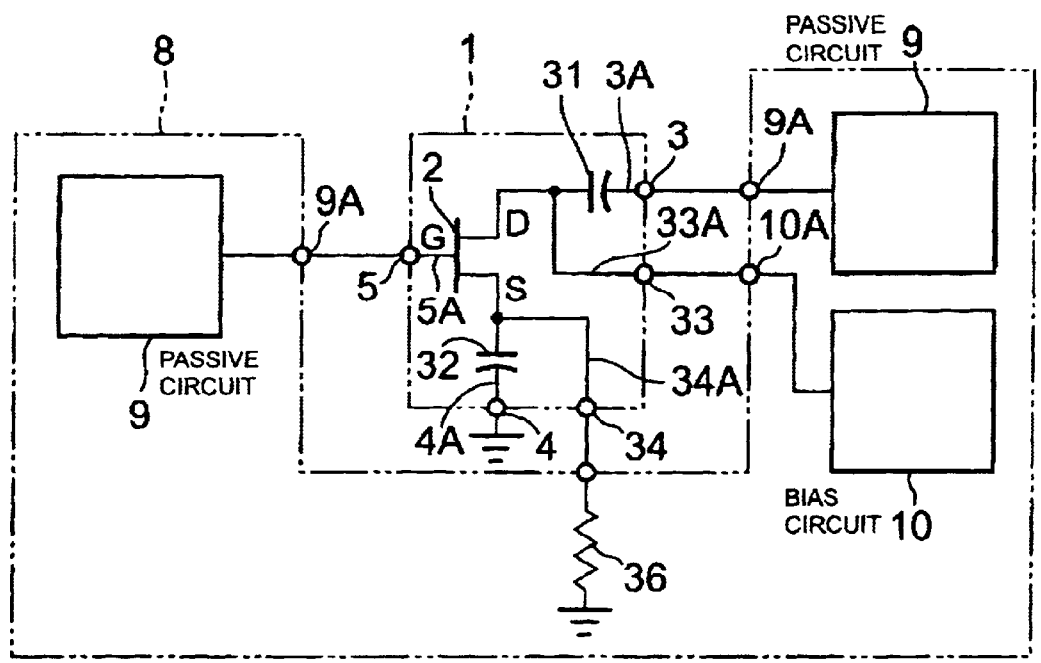
FIG. 13 is an electric circuit diagram illustrating the semiconductor device of the third embodiment when the source terminal on the semiconductor substrate is grounded to form a self-bias structure.
Figure 14:
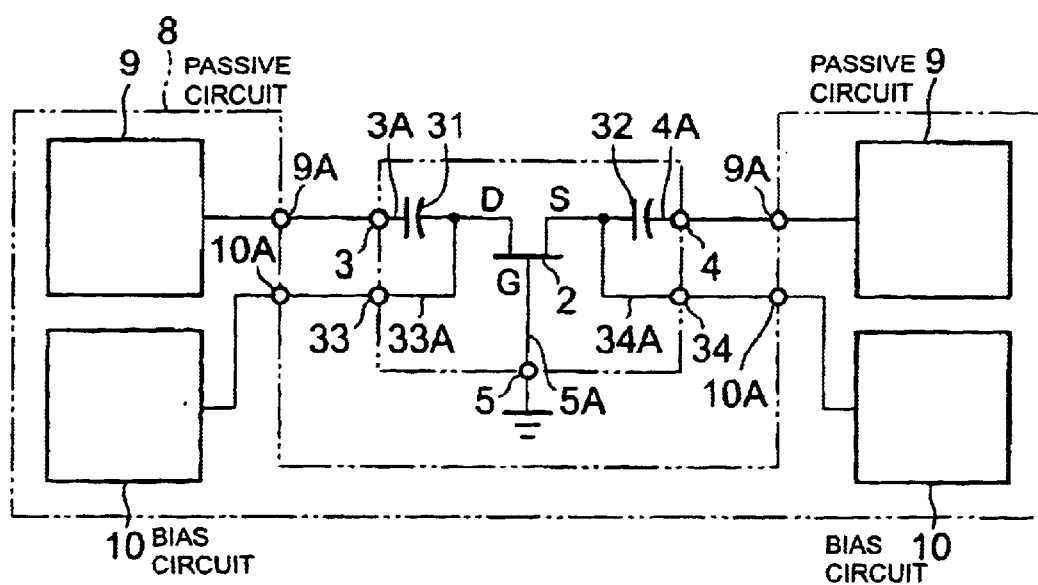
FIG. 14 is an electric circuit diagram illustrating the semiconductor device of the third embodiment when the gate terminal on the semiconductor substrate is grounded.

Although the gate terminal 5 of the FET 2 is connected, as shown in FIGS. 12 and 13, to the passive circuit 9 on the dielectric substrate 8, it may be grounded, as shown in FIG. 14.

Accordingly, advantages similar to those obtained by the first embodiment can be achieved. In the third embodiment, since the first and second MIM capacitors 31 and 32 are connected in series with the drain terminal 3 and the source terminal 4, respectively, bias voltages can be applied to drain D and source S of the FET 2 via the first and second bias terminals 33 and 34, respectively, to drive the FET 2.

A fourth embodiment of the present invention is discussed below with reference to FIGS. 15 through 17. In the fourth embodiment, MIM capacitors are connected in series between the FET 2 and each of the drain terminal 3, the source terminal 4, and the gate terminal 5. In the fourth embodiment, the same elements as those of the first embodiment are designated with like reference numerals, and an explanation thereof is thus omitted.

A first MIM capacitor 41 is provided between the FET 2 and the drain terminal 3. As with the MIM capacitor 6 of the first embodiment, the first MIM capacitor 41, which is formed by sandwiching a thin-film dielectric member with metallic layers, is disposed on the wiring pattern 3A connected to the drain terminal 3.

A second MIM capacitor 42 is connected between the FET 2 and the source terminal 4. The second MIM capacitor 42, which is formed by sandwiching a thin-film dielectric member with metallic layers, is disposed on the wiring pattern 4A connected to the source terminal 4.

A third MIM capacitor 43 is connected between the FET 2 and the gate terminal 5. The third MIM capacitor 43, which is formed by sandwiching a thin-film dielectric member with metallic layers, is disposed on the wiring pattern 5A connected to the gate terminal 5.

A first bias terminal 44, connected between the first MIM capacitor 41 and the FET 2, is connected to drain D of the FET 2 via a wiring pattern 44A branched off from the wiring pattern 3A, and is also connected to the bias circuit 10 on the dielectric substrate 8.

A second bias terminal 45, connected between the second MIM capacitor 42 and the FET 2, is connected to source S of the FET 2 via a wiring pattern 45A branched off from the wiring pattern 4A, and is also connected to the bias circuit 10 on the dielectric substrate 8.

A third bias terminal 46, connected between the third MIM capacitor 43 and the FET 2, is connected to gate G of the FET 2 via a wiring pattern 46A branched off from the wiring pattern 5A, and is also connected to the bias circuit 10 on the dielectric substrate 8.

Figure 15:
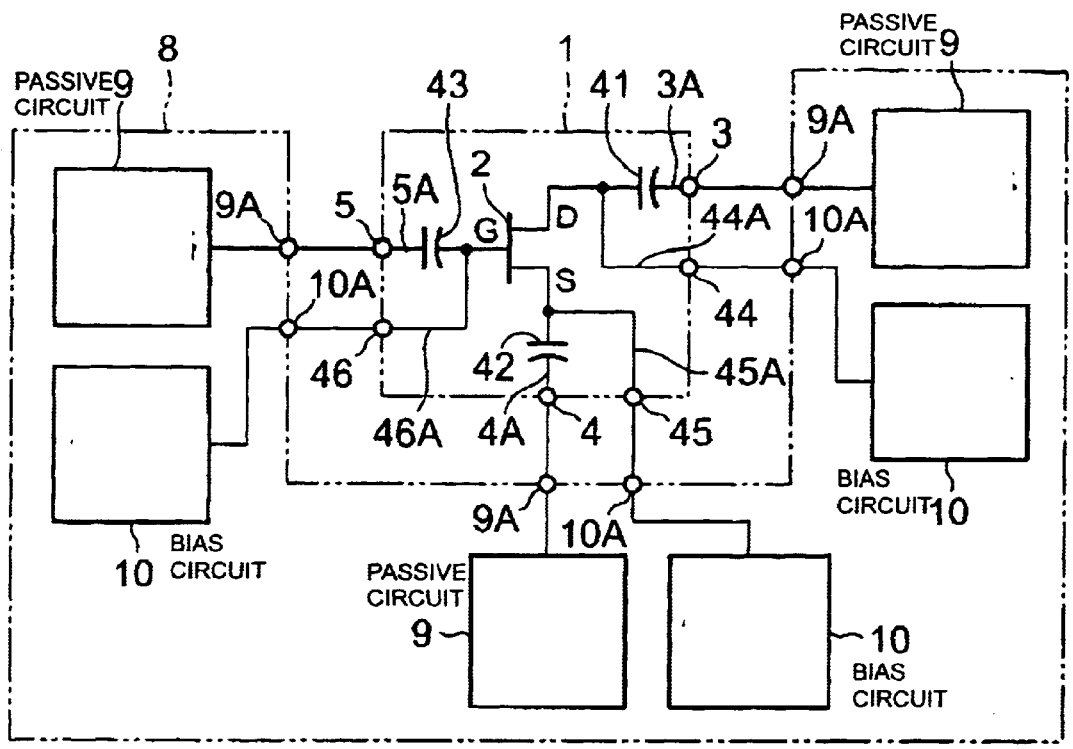
FIG. 15 is an electric circuit diagram illustrating a semiconductor device according to a forth embodiment of the present invention.
Figure 16:
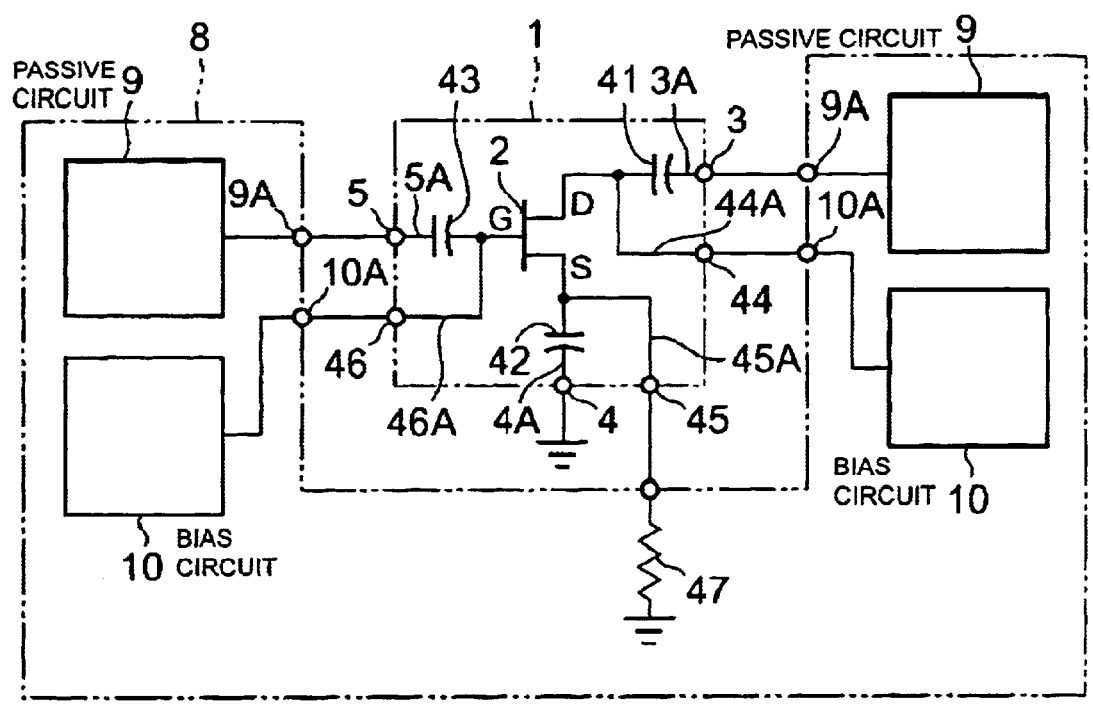
FIG. 16 is an electric circuit diagram illustrating the semiconductor device of the fourth embodiment when the source terminal on the semiconductor substrate is grounded to form a self-bias structure.

The source terminal 4 of the FET 2 is connected, as shown in FIG. 15, to the passive circuit 9 on the dielectric substrate 8. However, as shown in FIG. 16, the source terminal 4 of the FET 2 may be grounded, and the second bias terminal 45 may be connected to a self-biasing resistor 47 provided on the dielectric substrate 8.

Figure 17:
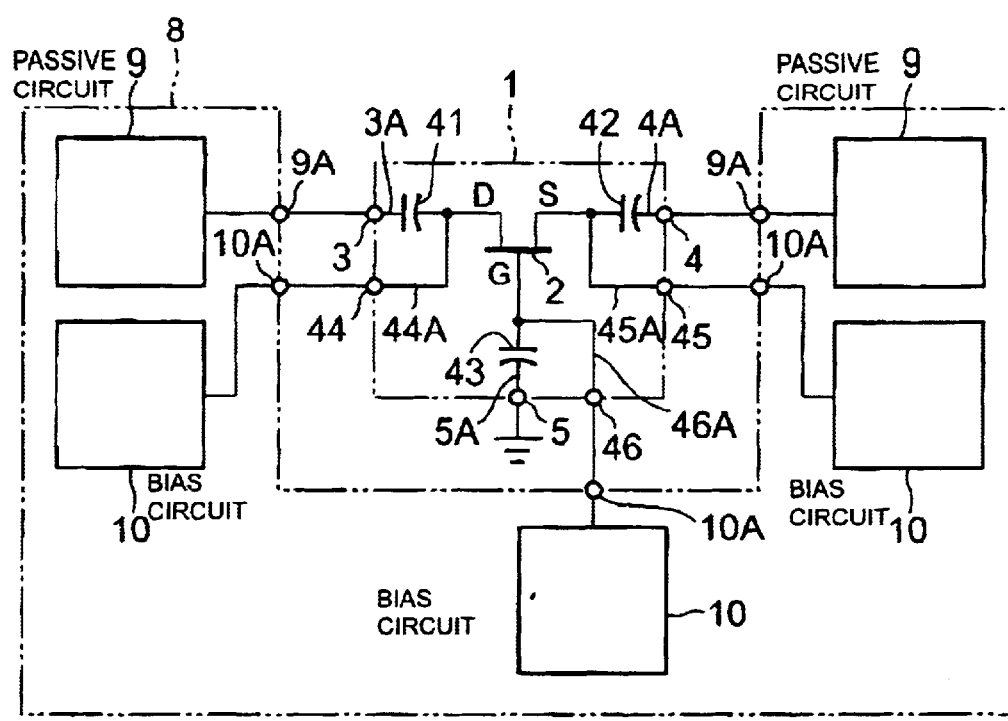
FIG. 17 is an electric circuit diagram illustrating the semiconductor device of the fourth embodiment when the gate terminal on the semiconductor substrate is grounded.

Alternatively, as shown in FIG. 17, the source terminal 4 of the FET 2 may be grounded, and also, the second bias terminal 45 may be connected to the bias circuit 10 on the dielectric substrate 8.

In the fourth embodiment, advantages similar to those obtained by the first embodiment can be achieved. In the fourth embodiment, since the first, second, and third MIM capacitors 41, 42, and 43 are connected in series with the drain terminal 3, the source terminal 4, and the gate terminal 5, respectively, bias voltages can be applied to drain D, source S, and gate G of the FET 2 via the first, second, and third bias terminals 44, 45, and 46, respectively, to drive the FET 2.

A fifth embodiment of the present invention is described below with reference to FIGS. 18 and 19. According to the fifth embodiment, a communication apparatus such as a transceiver apparatus is formed by using the semiconductor device of the present invention.

Figure 18:
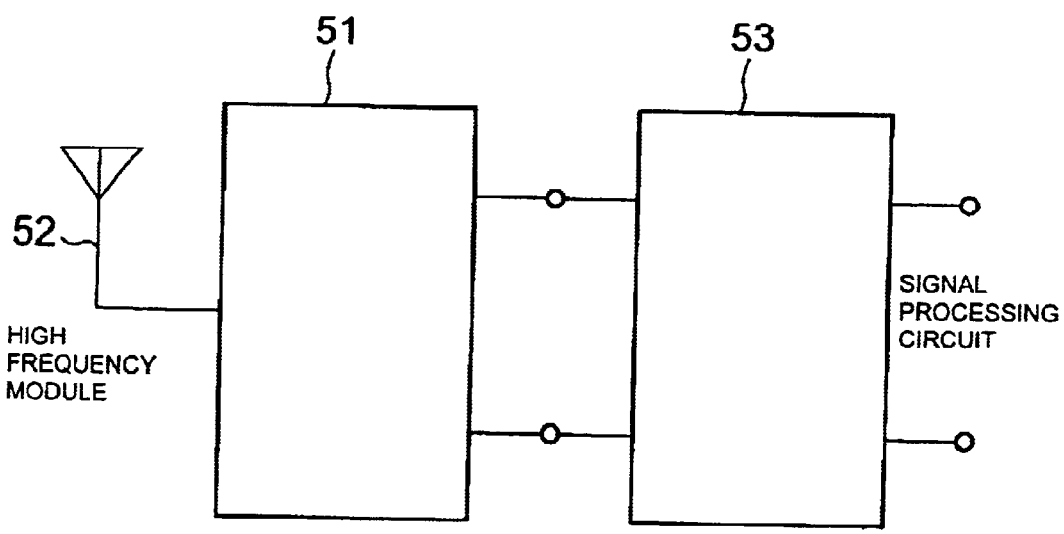
FIG. 18 is a block diagram illustrating a communication apparatus according to a fifth embodiment of the present invention.

As shown in FIG. 18, a high frequency module 51 is provided for transmitting and receiving high frequency signals in a microwave or millimeter wave band. An antenna 52 for transmitting and receiving high frequency signals is connected to the high frequency module 51, and also, a signal processing circuit 53 for performing signal processing on transmitting signals and received signals is connected to the high frequency module 51.

Figure 19:
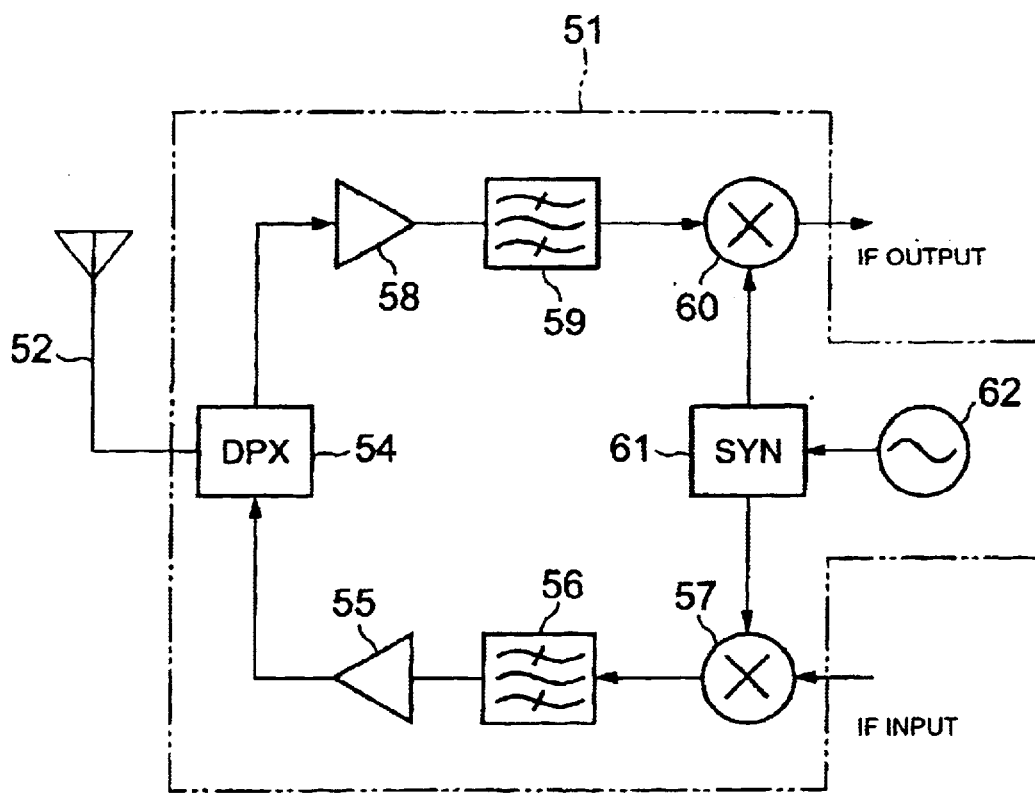
FIG. 19 is a block diagram illustrating a high frequency module used in the communication apparatus shown in FIG. 18.

The high frequency module 51 includes, as shown in FIG. 19, a duplexer 54, amplifiers 55 and 58, bandpass filters 56 and 59, mixers 57 and 60, a frequency synthesizer 61, an oscillator 62. The FET, which disclosed in the application, is used as for example the amplifiers 55 and 58, the mixers 57 and 60, the oscillator 62 and the like. The duplexer 54, which is connected to the antenna 52, is connected to the mixer 57 of the transmitter via the amplifier 55 and the bandpass filter 56, and is also connected to the mixer 60 of the receiver via the amplifier 58 and the bandpass filter 59. The mixers 57 and 60 are connected to the oscillator 62 via the frequency synthesizer 61.

The duplexer 54, the amplifiers 55 and 58, the bandpass filters 56 and 59, the mixers 57 and 60, the frequency synthesizer 61, and the oscillator 62 are formed by semiconductor devices including a semiconductor substrate and a dielectric substrate, such as those of the first through fourth embodiments.

The operation of the above-configured communication apparatus is as follows.

In transmitting a signal from the communication apparatus, the signal processing circuit 53 performs various types of signal processing to generate a transmitting intermediate frequency signal IF, and inputs the intermediate frequency signal IF into the mixer 57. Then, the mixer 57 mixes the intermediate frequency signal IF with a signal output from the oscillator 62. The resulting mixed output signal is filtered in the bandpass filter 56 so that only the signal components of the transmitting frequency band pass through the bandpass filter 56. The resulting signal is then amplified in the amplifier 55, and is then transmitted via the duplexer 54 and the antenna 52 as a high-frequency transmitting signal.

In receiving a signal with the communication apparatus, a high-frequency received signal received by the antenna 52 is input into the amplifier 58 via the duplexer 54. The received signal is then amplified in the amplifier 58, and filtered in the bandpass filter 59 so that only the signal components of the received frequency band pass through the bandpass filter 59. The resulting signal is then input into the mixer 60. The mixer 60 then mixes the signal with a signal output from the oscillator 62, and outputs the resulting intermediate frequency signal IF to the signal processing circuit 53. The signal processing circuit 53 then performs various types of signal processing on the intermediate frequency signal IF to demodulate the signal, such as digital data.

Accordingly, in the fifth embodiment, advantages similar to those offered by the first embodiment can be obtained.

Although in the fifth embodiment the semiconductor device of the present invention is used in a transceiver apparatus, it may be used in other types of apparatus as well, for example, a radar apparatus.

Although the present invention has been described in relation to particular embodiments thereof, many other variations and modifications and other uses will become apparent to those skilled in the art. Therefore, the present invention is not limited by the specific disclosure herein.

What is claimed is:

1. A semiconductor device comprising:
    a transistor;
    first and second main terminals connected respectively to first and second main electrodes of said transistor;
    a control terminal connected to a control electrode of said transistor;
    a metal insulator metal (MIM) capacitor connected in series between said transistor and at least one of said main and control terminals, said MIM capacitor comprising a thin-film dielectric sandwiched between metallic layers;
    a bias terminal connected between said MIM capacitor and said transistor, said MIM capacitor serving for blocking DC bias components applied to said bias terminal, and self-resonating in a desired frequency range of a high frequency signal; and
    a passive element connected to at least one of said control and main terminals,
    wherein said transistor, said control and main terminals, said MIM capacitor, and said bias terminal are disposed on a semiconductor substrate, and said passive element is disposed on a dielectric substrate.

2. A semiconductor device according to claim 1, further comprising a main substrate, said semiconductor substrate and dielectric substrate being disposed on said main substrate.

3. A semiconductor device according to claim 1, wherein said semiconductor substrate is disposed on said dielectric substrate.

4. A semiconductor device according to claim 1, wherein a respective said MIM capacitor is connected in series between said transistor and one of said main terminals.

5. A semiconductor device according to claim 1, wherein respective said MIM capacitors are connected in series between said transistor and each of said control terminal and one of said main terminals.

6. A semiconductor device according to claim 5, wherein the other one of said main terminals is grounded.

7. A semiconductor device according to claim 1, wherein respective said MIM capacitors are connected in series between said transistor and both of said main terminals.

8. A semiconductor device according to claim 7, wherein one of said main terminals is grounded.

9. A semiconductor device according to claim 7, wherein said control terminal is grounded.

10. A semiconductor device according to claim 1, wherein respective said MIM capacitors are connected in series between said transistor and both of said main terminals and said control terminal.

11. A semiconductor device according to claim 10, wherein one of said main terminals is grounded.

12. A semiconductor device according to any one of claims 1–3, wherein the dielectric constant of the dielectric substrate is higher than the dielectric constant of the semiconductor substrate.

13. A semiconductor device according to claim 1, wherein said transistor is a field effect transistor (FET), said control electrode is a gate electrode of said FET, and said main electrodes are source and drain electrodes of said FET.

14. An RF apparatus comprising:
    an RF circuit comprising at least one of a transmitting circuit and a receiving circuit;
    said RF circuit comprising at least one semiconductor device as set forth in claim 1.

* * * * *